US008639375B2

(12) United States Patent
Baseman et al.

(10) Patent No.: US 8,639,375 B2
(45) Date of Patent: *Jan. 28, 2014

(54) ENHANCING INVESTIGATION OF VARIABILITY BY INCLUSION OF SIMILAR OBJECTS WITH KNOWN DIFFERENCES TO THE ORIGINAL ONES

(71) Applicant: International Business Machines Corporation, Armonk, NY (US)

(72) Inventors: Robert J. Baseman, Brewster, NY (US); Tomasz J. Nowicki, Fort Montgomery, NY (US); Fateh A. Tipu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/682,184

(22) Filed: Nov. 20, 2012

(65) Prior Publication Data

US 2013/0103178 A1  Apr. 25, 2013

Related U.S. Application Data

(63) Continuation of application No. 12/775,107, filed on May 6, 2010, now Pat. No. 8,315,729.

(51) Int. Cl.
*G06F 17/00* (2006.01)
*G06F 11/30* (2006.01)

(52) U.S. Cl.
USPC ............................ 700/108; 700/110; 702/185

(58) Field of Classification Search
USPC ........ 700/95, 108, 109, 110, 121; 702/81, 82, 702/83, 84, 127, 182, 183, 184, 185; 438/14, 17, 18
See application file for complete search history.

(56) References Cited

U.S. PATENT DOCUMENTS

| | | | |
|---|---|---|---|
| 5,654,204 | A | 8/1997 | Anderson |
| 6,148,268 | A | 11/2000 | Wu et al. |
| 6,622,059 | B1 | 9/2003 | Toprac et al. |
| 6,699,727 | B1 | 3/2004 | Toprac et al. |
| 6,788,074 | B2 | 9/2004 | Sarma et al. |
| 7,136,716 | B2 | 11/2006 | Hsiung et al. |
| 7,192,790 | B2 | 3/2007 | Ishii et al. |
| 7,335,518 | B2 | 2/2008 | Ishii et al. |
| 7,397,259 | B1 | 7/2008 | Agarwal et al. |
| 7,587,298 | B2 | 9/2009 | Logan |
| 8,000,935 | B2 | 8/2011 | Logan |
| 2003/0083840 | A1 | 5/2003 | Corr |
| 2009/0099819 | A1 | 4/2009 | Logan |

OTHER PUBLICATIONS

Cottrell, A., "Regression Analysis: Basic Concepts", Feb. 3, 2003, http://www.wfu.edu/~cottrell/ecn215/regress.pdf.

(Continued)

*Primary Examiner* — Charles Kasenge
(74) *Attorney, Agent, or Firm* — Scully, Scott, Murphy & Presser, P.C.; Daniel P. Morris, Esq.

(57) ABSTRACT

A system, method and/or computer program product for analyzing a functionality of at least two manufactured products obtain a first characteristic of a first manufactured product. The system acquires a second characteristic of a second manufactured product. The system identifies a common feature between the first characteristic and the second characteristic. The system identifies a distinguishable feature between the first characteristic and the second characteristic. The system determines a cause of a deviation of a functionality in the first manufactured product or the second manufactured product or both manufactured products based on the identified common feature or the identified distinguishable feature or both features.

19 Claims, 4 Drawing Sheets

(56) References Cited

OTHER PUBLICATIONS

Baker, S. L., "Multiple Regression Theory", 2006, http://hadm.sph.sc.edu/Courses/J716/pdf/716-3%20Multiple%20Regression.pdf.

Seifert, J. W.., "Data Mining: An Overview", Dec. 16, 2004, Congressional Research Service Report for Congress, The Library of Congress.

Gelman, A., "Analysis of variance—why it is more important than ever", Jan. 10, 2004, Columbia University.

Higgins, J., in "The Radical Statistician: Unleashing the Power of Applied Statistics in the Real World", Chapter 2, 2005.

U.S. Office Action dated Mar. 28, 2012 in related U.S. Appl. No. 12/775,107.

Notice of Allowance dated Jul. 11, 2012 in related U.S. Appl. No. 12/775,107.

ENHANCING INVESTIGATION OF VARIABILITY BY INCLUSION OF SIMILAR OBJECTS WITH KNOWN DIFFERENCES TO THE ORIGINAL ONES

CROSS REFERENCE TO RELATED APPLICATION

This application is a continuation of U.S. patent application Ser. No. 12/775,107, filed May 6, 2010, the entire content and disclosure of which is incorporated herein by reference.

BACKGROUND

The present invention generally relates to analyzing a functionality of at least one manufacturing product (e.g., a semiconductor product, etc.). More particularly, the present invention relates to determining a cause of a deviation of the functionality of the manufacturing product.

A manufactured product includes, but is not limited to, a semiconductor product, semiconductor chip, a semiconductor wafer, a semiconductor wafer lot, a semiconductor device, an electronic device, a mechanical device, a medical device, etc. A semiconductor product includes at least one semiconductor device. In this present disclosure, a functionality of a semiconductor device refers to a characteristic of the semiconductor device. A characteristic of a semiconductor device includes, but is not limited to an amount of leakage current in the semiconductor device, a threshold voltage in the semiconductor device, a capacitance of the semiconductor device, an operating frequency of the semiconductor device, etc.

Many defects on a semiconductor product have unclear root causes. Some elements (e.g., a transistor in a semiconductor chip, etc.) of the semiconductor product are sensitive to minimal changes of manufacturing process conditions while the others (e.g., a semiconductor device substrate, etc.) are more robust. In the present disclosure, sensitivity refers to a frequency or tendency of deviation from a corresponding product specification.

However, with traditional techniques, it is not always possible to indicate a possible dependence of an error occurring during a particular semiconductor manufacturing step, e.g., the error occurs due to a defect on the particular semiconductor manufacturing step. Thus, it is desirable to find such dependence that can be interpreted as a possible cause-effect relation and to take a correctional action to ensure characteristic(s) of manufactured product(s) comply with a corresponding product specification.

SUMMARY OF THE INVENTION

The present invention describes a system, method and computer program product for analyzing a functionality of at least two manufactured products to determine a cause of a functional deviation from a corresponding manufactured product specification.

In one embodiment, there is provided a system for analyzing a functionality of at least two manufactured products. The system comprises a memory device and a processor connected to the memory device. The system obtains a first characteristic of a first manufactured product. The system acquires a second characteristic of a second manufactured product. The system identifies a common feature between the first characteristic and the second characteristic. The system identifies a distinguishable feature between the first characteristic and the second characteristic. The system determines a cause of a deviation of a functionality in the first manufactured product or the second manufactured product or both manufactured products based on the identified common feature or the identified distinguishable feature or both features.

In a further embodiment, the common feature and the distinguishable feature are identified based on measurements on the first manufactured product and the second manufactured product.

In a further embodiment, the measurements include an operating frequency measurement, an electric current measurement and an electric capacitance measurement.

In a further embodiment, the first manufactured product is an n-type transistor having at least one feature and the second manufactured product is a p-type transistor having at least one feature.

BRIEF DESCRIPTION OF THE DRAWINGS

The accompanying drawings are included to provide a further understanding of the present invention, and are incorporated in and constitute a part of this specification.

DETAILED DESCRIPTION

Figure 1:
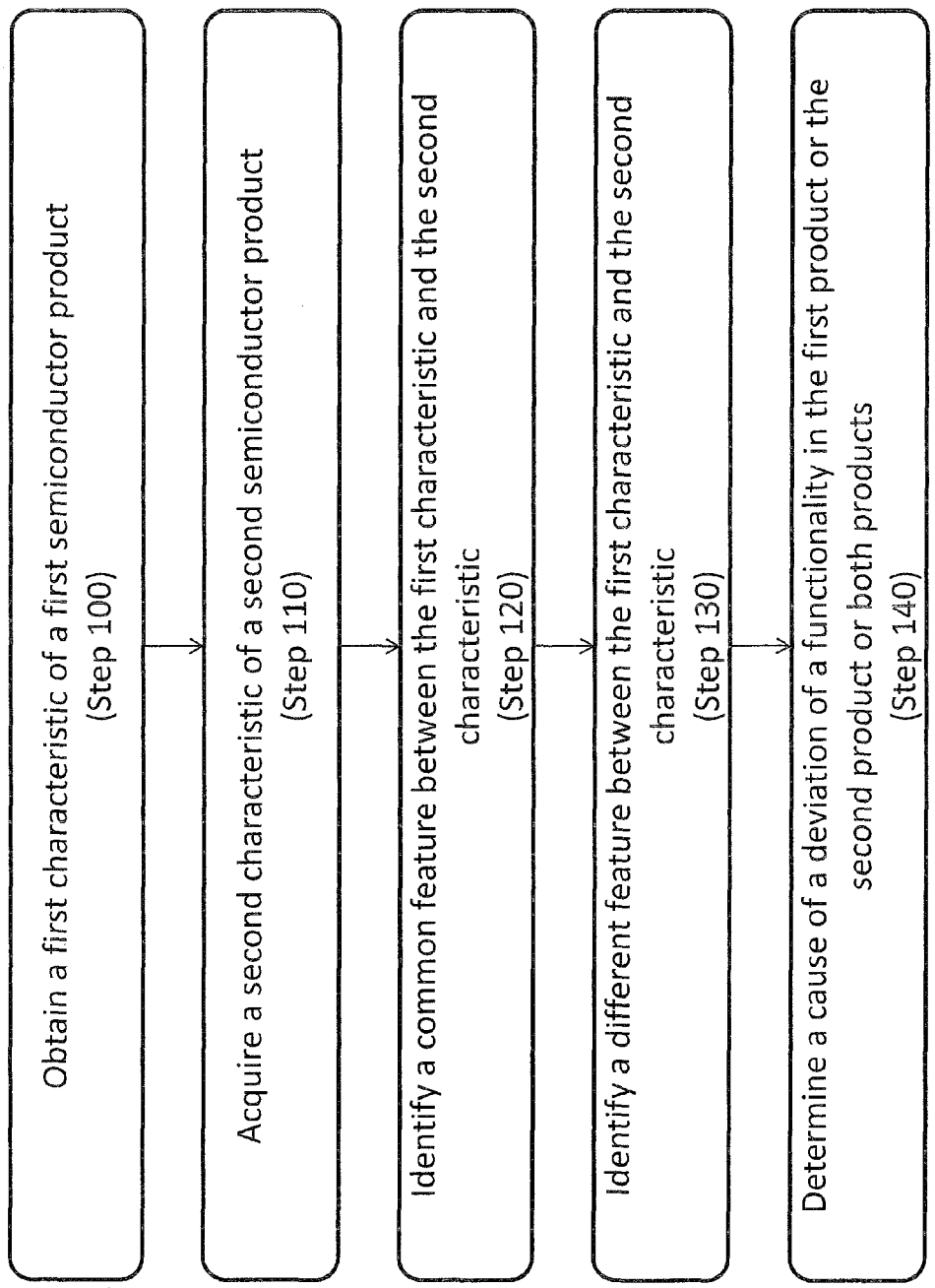
FIG. 1 illustrates a flow chart illustrating method steps for analyzing a functionality of at least two semiconductor devices in one embodiment.

FIG. 1 illustrates a flow chart illustrating method steps for analyzing a functionality of at least two manufactured products (e.g., at least two semiconductor devices) in one embodiment. The two semiconductor devices refer to semiconductor devices that are manufactured using semiconductor manufacturing steps (e.g., ion deposition and/or etching steps) and/or tools, and that had electrical functionalities (e.g., amplifying or switching electronic signals, etc.). At step 100, a computing system (e.g., a computing system 200 in FIG. 2) including at least one memory device and at least processor device obtains a first characteristic of a first manufactured product (e.g., n-type transistor), e.g., by one or more of measuring: an operating frequency of the first manufactured product, measuring an electric current of the first manufactured product, and/or measuring an electric capacitance of the first manufactured product. At step 120, the system obtains a second characteristic of a second manufactured product (e.g., p-type transistor) in the same manner, e.g., by measuring an operating frequency of the second manufactured product, measuring an electric current of the second manufactured product, and measuring an electric capacitance of the second manufactured product.

In one embodiment, the first manufactured product and the second manufactured product are similar but are not identical. For example, the first manufactured product is a sensitive n-type transistor ("nFET") having at least one feature, e.g., a specific operating voltage, a specific threshold voltage, a specific electric current, a specific operating temperature, etc. The second manufactured product is a less sensitive p-type transistor ("pFET") having at least one feature, e.g., a specific operating voltage, a specific threshold voltage, a specific electric current, a specific operating temperature, etc. Sensitivity refers to a frequency or tendency of deviation from a corresponding product specification. In a further embodiment, sensitivity is determined with respect to at least two measurements: electric current measurements (in unit of Amperes) and electric capacitance measurement (in unit of Farads). For example, lower values (e.g., an electric current measurement value lower than an electric current value specified in a corresponding manufactured product specification) of electric current measurements and/or higher values (e.g., an electric capacitance measurement higher than an electric capacitance value specified in a corresponding manufactured product specification) of the electric capacitance measurements can cause a corresponding manufactured product to be faulty.

In one embodiment, the computing system considers not only the measurements of a manufactured product (e.g., n-type transistor) but also the measurements of a similar manufactured product (e.g., p-type transistor) which is less sensitive, and consequently, less often flagged as an "out of spec" event, i.e., an event indicating an occurrence of a measurement of a manufactured product that deviates from a corresponding device specification. In a further embodiment, data (e.g., leakage current values, etc.) on such measurements are stored in a storage device (e.g., a disk 221 and/or a tape drive 240 in FIG. 2) or a memory device (e.g., a random access memory device 214 and/or a read-only memory device 216 in FIG. 2) and can be used to expand an analysis (e.g., steps 120-140 in FIG. 1) of the measurements.

Returning to FIG. 1, in one embodiment, to identify the first characteristic of the first manufactured product at step 100, the computing system collects measurements associated with the first manufactured product. To identify the second characteristic of the second manufactured product at step 110, the computing system collects measurements associated with the second manufactured product. Then, the computing system analyzes the first manufactured product measurements and the second manufactured product measurements, e.g., by using correlation, regression and multiple regression, analysis of variance (ANOVA), data mining, etc. In a further embodiment, as the system obtains more measurements on the first manufactured product and/or the second manufactured product, the analysis performed by the system can be more reliable.

A correlation refers to a degree of association between two random variables (e.g., two different measurements). Usually, the degree of association is represented by a correlation coefficient. (See Jim Higgins, Ed.D., Chapter 2 in "The Radical Statistician: Unleashing The Power Of Applied Statistics In The Real World, 2005, wholly incorporated by reference as if set forth herein, describing how to determine correlation and correlation coefficient in detail.) Regression refers to a technique for sequentially modeling and testing a plurality of variables (e.g., a plurality of measurements) while focusing on a relationship between the variables. Allin Cottrell, "Regression Analysis: Basic Concepts", Feb. 3, 2003, http://www.wfu.edu/~cottrell/ecn215/regress.pdf, wholly incorporated by reference as if set forth herein, describe regression in detail. Multiple regression refers to a technique for simultaneously testing and modeling of a plurality of variables (e.g., a plurality of measurements). Samuel L. Baker, "Multiple Regression Theory", 2006, http://hadm.sph.sc.edu/Courses/J716/pdf/716-3%20Multiple%20Regression.pdf, wholly incorporated by reference as if set forth herein, describe multiple regression in detail. ANOVA refers to a technique for testing hypotheses about differences between two or more means (i.e., averages) and/or for comparing the means of two or more samples (e.g., measurements) simultaneously. Andrew Gelman, "Analysis of variance—why it is more important than ever", Jan. 10, 2004, Columbia University, wholly incorporated by reference as if set forth herein, describe ANOVA in detail. Data mining refers to a technique for extracting valuable information (e.g., similarity and/or difference between measurements) from data (e.g., measurements). Jeffrey W. Seifert, "Data Mining: An Overview", Dec. 16, 2004, Congressional Research Service Report for Congress, The library of Congress, wholly incorporated by reference as if set forth herein, describe data mining technique in detail.

Returning to FIG. 1, while performing the analysis (e.g., correlation, regression, etc.), the system identifies a common feature between the first characteristic and the second characteristic at step 120 and identifies a distinguishable feature between the first characteristic and the second characteristic at step 130. The system may identify the common feature and/or distinguishable feature based on the measurements on the first manufactured product and the second manufactured product.

At step 140, the system determines a cause of a deviation of a functionality in the first manufactured product or the second semiconductor or both manufactured products based on the identified common feature or the identified distinguishable feature or both features. For example, if the system determines capacitances of n-type transistors and p-type transistors are higher than their specifications, then the system may determine that a gate size, gate thickness, and/or gate ionization injection of the transistors may be a cause of the higher capacitances, e.g., based on a look-up table that matches each deviation and a possible cause of the deviation. Upon determining the cause of the deviation, the system may identify a manufacturing tool that affects or influences the cause of the deviation. For example, if the system determines that the gate size, gate thickness, and/or gate ionization injection of the transistors may be a cause of the higher capacitances, the system identifies at least one semiconductor manufacturing tool that affects a gate of a transistor, e.g., based on a look-up table, engineering knowledge and/or database that matches a manufacturing tool and its influence on a manufactured product. When identifying the influencing manufacturing tool, the system may filter out at least one manufacturing tool that unlikely affects or influences the cause of the deviation, e.g., based on the look-up table, engineering knowledge and/or database that matches a manufacturing tool and its influence on a manufactured product. The computing system can perform steps 120-130 concurrently or alternatively (e.g., only performing step 120 without performing step 130).

In one embodiment, the system increases an accuracy of the determination (determining a cause of the deviation), e.g., by gathering measurements of the first manufactured product as well as measurements of the second manufactured product. The more measurements the system obtains, the more accuracy of the determination the system acquires.

Following describes exemplary analyses corresponding to steps 120-140 in FIG. 1. Suppose that the system receives measurements on both semiconductor devices (e.g., n-type transistor and p-type transistor that may or may not have distinguishable characteristics) continuously and that the measurements are not binary values (e.g., "out of spec" flags—measurements are deviated from a corresponding device specification) and that there is dependency (e.g., partially common manufacturing process steps being used for both semiconductor devices—furnaces anneals, oxidation, rapid thermal anneal, metrication, etc.). Dependency includes, but is not limited to correlation, similarity, etc.

1. An exemplary analysis corresponding to steps 120 and 140 in FIG. 1: If electric current measurements on both semiconductor devices are decreasing in a period during which measurements on a first semiconductor device (e.g., n-type transistor) deviate from the corresponding device specification but those on a second semiconductor device (e.g., p-type transistor) comply with the specification, then the computing system may identify that the common feature of both semiconductor devices during the period is the decrease of electric current measurements at step 120 in FIG. 1. At step 140 in FIG. 1, the computing system may decide that the cause of the deviation lies in a part of manufacturing process steps and/or tools common to both semiconductor devices and having similar physical effects (e.g., decreasing electric current) for both semiconductor devices. These manufacturing process steps and/or tools common to both semiconductor devices and having similar physical effects (e.g., decreasing electric current) for both semiconductor devices include, but are not limited to, furnaces anneals, oxidation, rapid thermal anneal, metrication, etc. The computing system continues to obtain measurements of both semiconductor devices in these manufacturing steps/tools.

2. An exemplary analysis corresponding to steps 130-140 in FIG. 1: If the electric current measurements on the first semiconductor device decrease but those on the second semiconductor device increase in a period during which measurements on the first semiconductor device deviate from the specification but those on the second semiconductor device comply with the specification, then the computing system may identify that the distinguishable feature of both semiconductor devices during the period is the decrease and increase of electric current measurements at step 120 in FIG.1. At step 140 in FIG.1, the computing system may decide that the cause of the deviation may be in a part of the semiconductor process steps and/or tools common to both semiconductor devices and having opposite physical effects for both semiconductor devices. A semiconductor process step and/or tool common to both semiconductor devices and having opposite physical effects for both semiconductor devices includes, but is not limited to, source-drain (SD) anneal variation, etc. The computing system continues to obtain measurements of both semiconductor devices in these manufacturing steps/tools.

3. An exemplary analysis corresponding to steps 120-140 in FIG. 1: If a change in the first semiconductor device does not correlate with a change in the second semiconductor device, then the computing system cannot identify the common and/or distinguishable feature at steps 120-130 in FIG. 1. At step 140 in FIG. 1, the computing system decides that the cause of the deviation is in a part of semiconductor manufacturing process steps and/or tools which exist for the first semiconductor device but does not exist for the second semiconductor device. A semiconductor manufacturing process step and/or tool which exists for the first semiconductor device but does not exist for the second semiconductor device includes, but is not limited to, nFET and/or pFET specific ion implantation, etc. The computing system continues to obtain measurements of both semiconductor devices in these manufacturing steps/tools.

Thus, by using these exemplary analyses, the system narrows down a search space for the cause of the deviation and/or on-going monitoring. In other words, a user does not need to inspect whole manufacturing steps to find the cause of the deviation and/or to conduct on-going monitoring. The user may need to inspect only particular manufacturing steps and/or tools found at step 140 in FIG. 1. In a further exemplary embodiment, there may be provided an optimal function of both semiconductor devices, e.g., in product specifications. The computing system may determine an abnormality of a semiconductor device, a semiconductor manufacturing step/tool requiring on-going monitoring, a cause of the abnormality device, e.g., based on the optimal function described in the product specifications.

Figure 3:
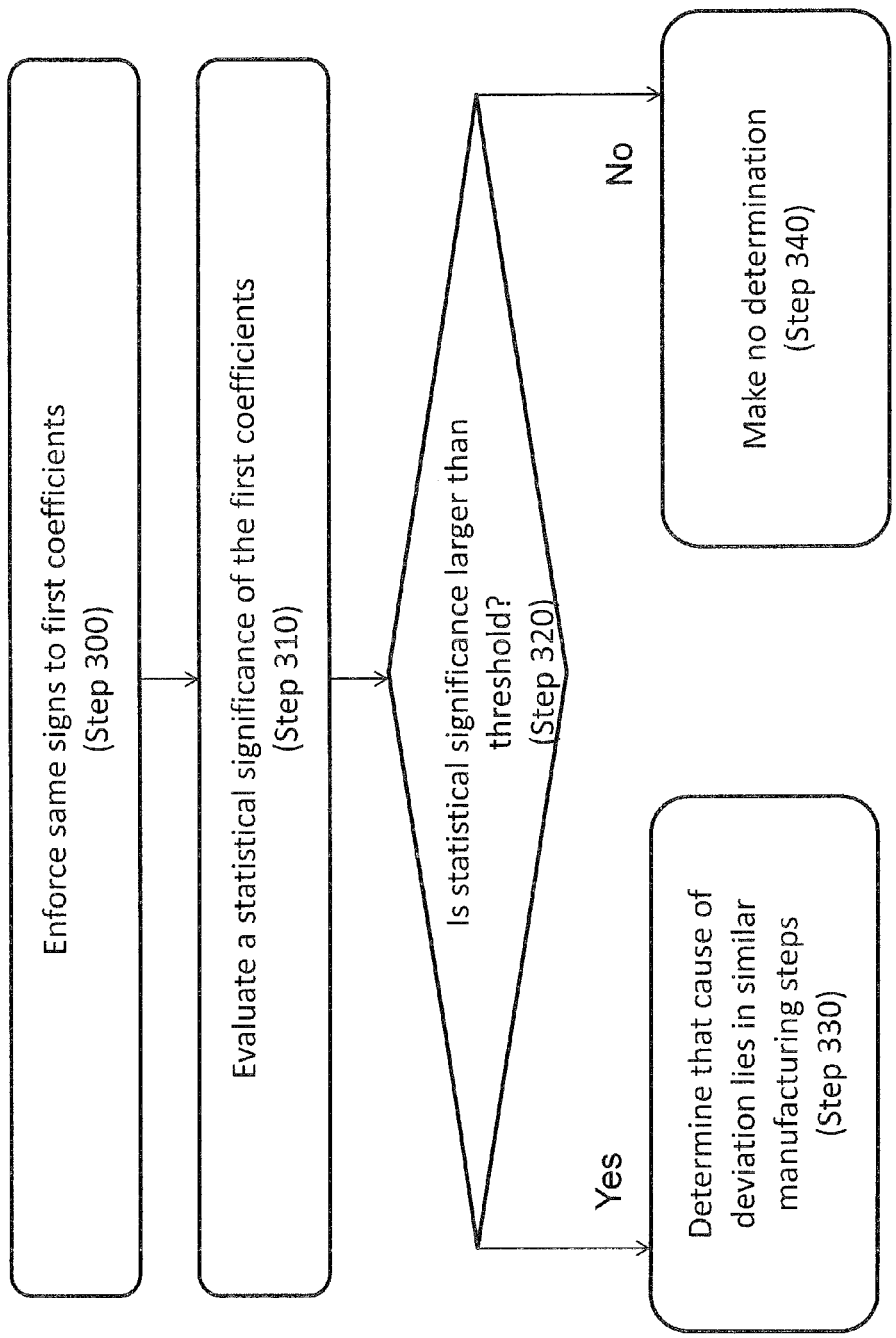
FIG. 3 illustrates a flow chart illustrating method steps for regression analysis in one embodiment.

As described above, the system uses the common features (or similar features) and the distinguishable features to determine the cause of the deviation. FIG. 3 illustrates a flow chart illustrating method steps for regression analysis in one exemplary embodiment. By employing a regression technique, at step 300, the computing system enforces same signs to first coefficients applied to the first semiconductor device measurements and the second semiconductor device measurements which correspond to similar manufacturing steps. At step 310, the computing system evaluates a statistical significance of the first coefficients. A statistical significance is determined by a probability that a corresponding event has not happened. Thus, If "P" refers to a probability that the event has occurred so far, a larger value of "P" (e.g., "P"=0.8) corresponds to a small value of the statistical significance (e.g., statistical significance=1−0.8=0.2). At steps 320-330, the computing system decides that the cause of the deviation lies in a part of the similar manufacturing steps if the statistical significance of the first coefficients is larger than a threshold (e.g., 0.998). Otherwise, at step 340, the computing system makes no decision on the cause of the deviation. The similar manufacturing steps may commonly exist for the first semiconductor device and the second semiconductor device and configure both semiconductor devices to operate in a similar or identical way.

Figure 4:
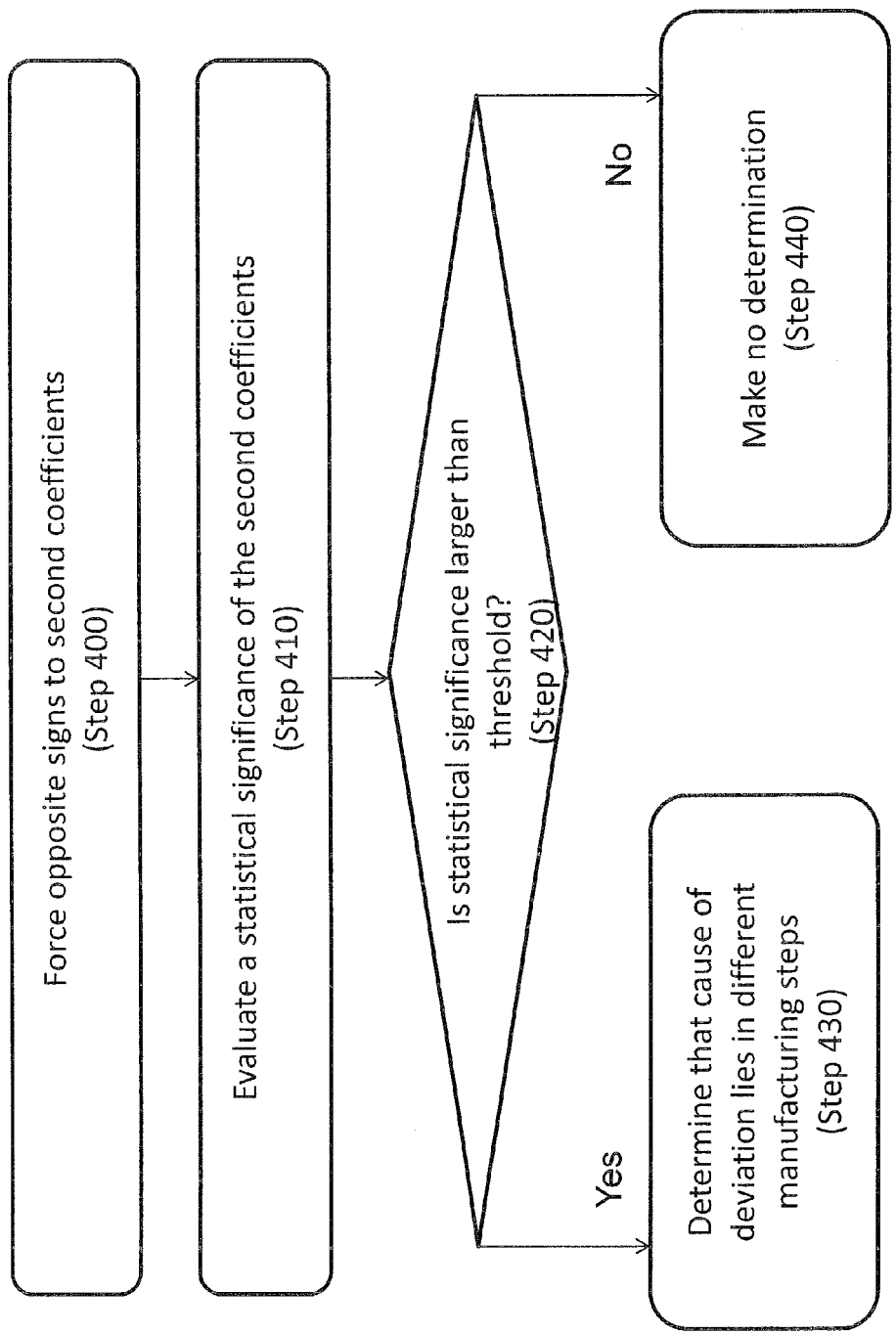
FIG. 4 illustrates a flow chart illustrating method steps for regression analysis in another embodiment.

FIG. 4 illustrates a flow chart illustrating method steps for regression analysis in another exemplary embodiment. By employing the regression technique, at step 400, the computing system forces opposite signs to second coefficients applied to the first semiconductor device measurements and the second semiconductor device measurements which correspond to different manufacturing steps. At step 410, the computing system evaluates a statistical significance of the second coefficients. At steps 420-430, the computing system decides that the cause of the deviation lies in a part of the different manufacturing steps if the statistical significance of the second coefficients is larger than a threshold (e.g., 0.998). Otherwise, at step 440, the computing system makes no decision on the cause of the deviation. The different manufacturing steps may exist for the first semiconductor device or for the second semiconductor device but not for both semiconductor devices.

In one embodiment, the system uses the "out of spec" flag on one semiconductor device (e.g., n-type transistor) to trigger the analysis on the semiconductor device (e.g., n-type transistor) and a similar semiconductor device (e.g., p-type transistor), where the similar device (e.g., p-type transistor) might not be flagged, but may show a similar tendency of a loss of functionality (e.g., augmented electric capacitance, etc.).

Figure 2:
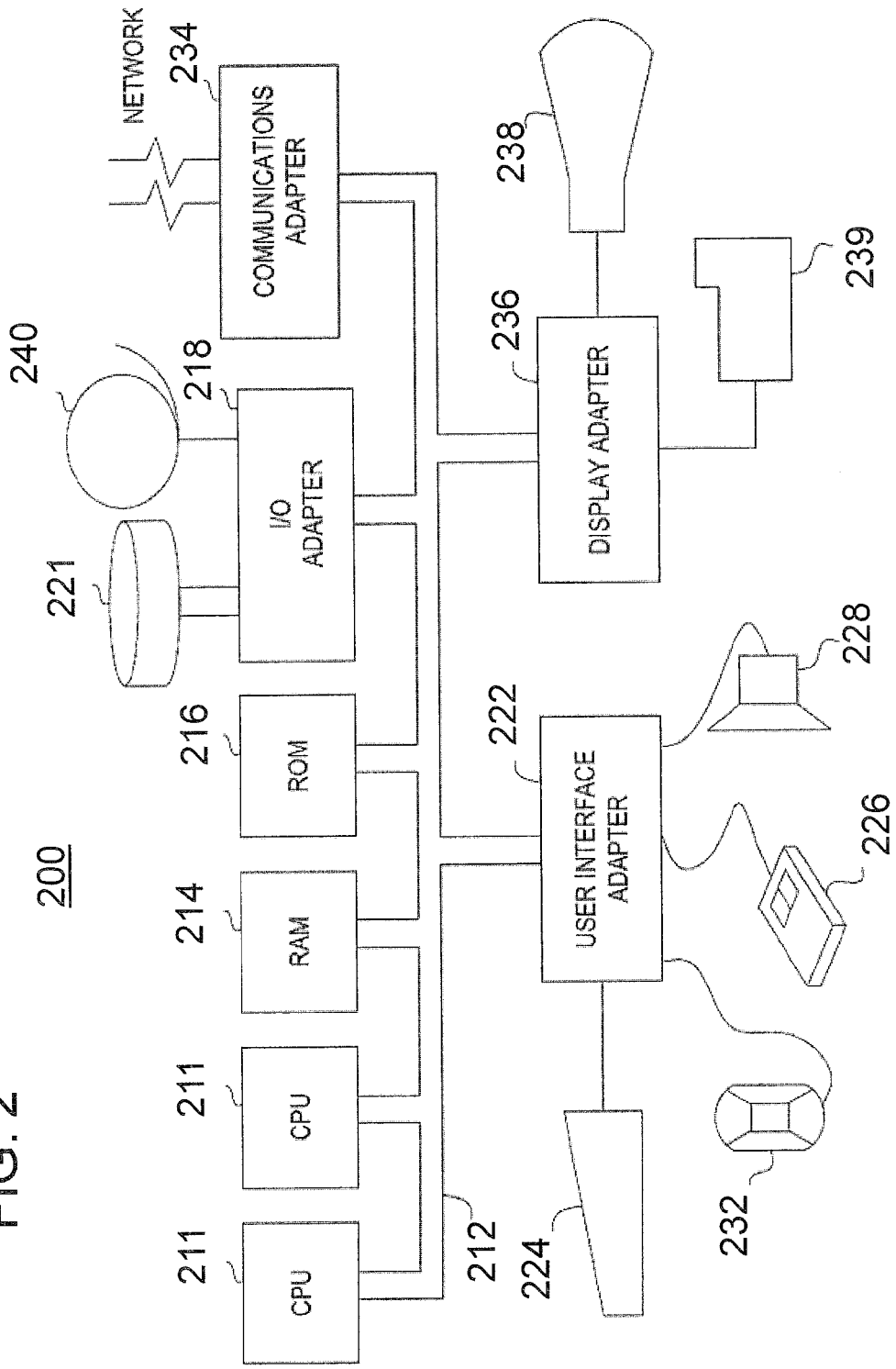
FIG. 2 illustrates an exemplary hardware configuration for implementing the flow chart depicted in FIG. 1 in one embodiment.

FIG. 2 illustrates an exemplary hardware configuration of a computing system 200 running and/or implementing the method steps in FIG. 1. The hardware configuration preferably has at least one processor or central processing unit (CPU) 211. The CPUs 211 are interconnected via a system bus 212 to a random access memory (RAM) 214, read-only memory (ROM) 216, input/output (I/O) adapter 218 (for connecting peripheral devices such as disk units 221 and tape drives 240 to the bus 212), user interface adapter 222 (for connecting a keyboard 224, mouse 226, speaker 228, microphone 232, and/or other user interface device to the bus 212), a communication adapter 234 for connecting the system 200 to a data processing network, the Internet, an Intranet, a local area network (LAN), etc., and a display adapter 236 for connecting the bus 212 to a display device 238 and/or printer 239 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for analyzing a functional deviation of one or more transistor device products, the method including:
   manufacturing a first transistor product of a first polarity type and a second transistor product of a second polarity type by using similar manufacturing steps;
   collecting first measurements associated with the manufactured first polarity type transistor product;
   collecting second measurements associated with the manufactured second polarity type transistor product;
   detecting a deviation in functionality in the manufactured first polarity type transistor product, the manufactured second polarity type transistor product or both the manufactured first polarity type transistor and second polarity type transistor products, based on the first collected measurements and the second collected measurements;
determining a cause of the detected deviation;
identifying at least one manufacturing tool associated with the determined cause of the detected deviation; and
wherein a processor coupled to a memory device performs the collecting the first measurements, the collecting the second measurements, the detecting, the determining, and the identifying.

2. The method according to claim 1, wherein the manufactured first polarity type transistor product is a n-type transistor, and the manufactured second polarity type transistor product is a p-type transistor.

3. The method according to claim 2, wherein the first collected measurements and the second collected measurements include an operating frequency measurement, an electric current measurement and an electric capacitance measurement.

4. The method according to claim 3, further comprising:
collecting the electric capacitance measurement of the n-type transistor;
collecting the electric capacitance measurement of the p-type transistor;
determining whether both the electric capacitance measurement of the n-type transistor and the electric capacitance measurement of the p-type transistor are higher than an electric capacitance specified in a corresponding transistor specification;
in response to determining that both the electric capacitance measurement of the n-type transistor and the electric capacitance measurement of the p-type transistor are higher than the electric capacitance specified in said corresponding transistor specification, determining that the cause of the higher capacitance is one or more of: gate sizes of the n-type transistor and the p-type transistor, gate thickness of the n-type transistor and the p-type transistor, and gate ionization injection of the n-type transistor and the p-type transistor; and
identifying one or more manufacturing tools that affect the gate sizes, the gate thickness, and the gate ionization.

5. The method according to claim 3, further comprising:
collecting the electric current measurement of the n-type transistor;
collecting the electric current measurement of the p-type transistor;
determining whether the electric current measurement of the n-type transistor deviates an electric current specified in a corresponding transistor specification and whether the electric current measurement of the p-type transistor complies with the specification; and
in response to determining that the electric current measurement of the n-type transistor deviates the electric current specified in the corresponding transistor specification but the electric current measurement of the p-type transistor complies with the specification, determining that the cause of the deviation lies in one or more manufacturing tools that are common to both the n-type transistor and the p-type transistor.

6. The method according to claim 3, further comprising:
collecting the electric current measurement of the n-type transistor;
collecting the electric current measurement of the p-type transistor;
determining whether the electric current measurement of the n-type transistor is less than an electric current specified in a corresponding transistor specification and whether the electric current measurement of the p-type transistor is higher than the electric current specified in the specification; and
in response to determining that the electric current measurement of the n-type transistor is less than the electric current specified in the corresponding transistor specification but the electric current measurement of the p-type transistor is higher than the electric current specified in the specification, determining that the cause of the deviation lies in one or more manufacturing tools that are common to both the n-type transistor and the p-type transistor but have opposite physical effects to both transistors.

7. The method according to claim 3, further comprising:
determining whether the first collected measurements of the first product correlates with the second collected measurements of the second product; and
in response to determining that the first collected measurements of the first product does not correlate with the second collected measurements of the second product, determining that the cause of the deviation lies in one or more manufacturing tools that exist for the first manufactured product but does not exist for the second manufactured product.

8. The method according to claim 1, further comprising:
identifying one or more manufacturing tools that neither affects nor influences the determined cause of the detected deviation.

9. A system for analyzing a functional deviation of one or more transistor device products, the system including:
manufacturing tools manufacturing a first transistor product of a first polarity type and a second transistor product of a second polarity type by using similar manufacturing steps;
a memory device; and
a processor coupled to the memory device, wherein the processor is configured to perform steps of:
collecting first measurements associated with the manufactured first polarity type transistor product;
collecting second measurements associated with the manufactured second polarity type transistor product;
detecting a deviation in functionality in the manufactured first polarity type transistor product, the manufactured second polarity type transistor product or both the manufactured first polarity type transistor and second polarity type transistor products, based on the first collected measurements and the second collected measurements;
determining a cause of the detected deviation; and
identifying at least one manufacturing tool associated with the determined cause of the detected deviation.

10. The system according to claim 9, wherein the manufactured first polarity type transistor product is a n-type transistor, and the manufactured second polarity type transistor product is a p-type transistor.

11. The system according to claim 10, wherein the first collected measurements and the second collected measurements include an operating frequency measurement, an electric current measurement and an electric capacitance measurement.

12. The system according to claim 11, wherein the processor is further configured to perform steps of:
collecting the electric capacitance measurement of the n-type transistor;
collecting the electric capacitance measurement of the p-type transistor;

determining whether both the electric capacitance measurement of the n-type transistor and the electric capacitance measurement of the p-type transistor are higher than an electric capacitance specified in a corresponding transistor specification;

in response to determining that both the electric capacitance measurement of the n-type transistor and the electric capacitance measurement of the p-type transistor are higher than the electric capacitance specified in said corresponding transistor specification, determining that the cause of the higher capacitance is one or more of: gate sizes of the n-type transistor and the p-type transistor, gate thickness of the n-type transistor and the p-type transistor, and gate ionization injection of the n-type transistor and the p-type transistor; and identifying one or more manufacturing tools that affect the gate sizes, the gate thickness, and the gate ionization.

13. The system according to claim 11, wherein the processor is further configured to perform steps of:

collecting the electric current measurement of the n-type transistor;

collecting the electric current measurement of the p-type transistor;

determining whether the electric current measurement of the n-type transistor deviates an electric current specified in a corresponding transistor specification and whether the electric current measurement of the p-type transistor complies with the specification; and in response to determining that the electric current measurement of the n-type transistor deviates the electric current specified in the corresponding transistor specification but the electric current measurement of the p-type transistor complies with the specification, determining that the cause of the deviation lies in one or more manufacturing tools that are common to both the n-type transistor and the p-type transistor.

14. The system according to claim 11, wherein the processor is further configured to perform steps of:

collecting the electric current measurement of the n-type transistor;

collecting the electric current measurement of the p-type transistor;

determining whether the electric current measurement of the n-type transistor is less than an electric current specified in a corresponding transistor specification and whether the electric current measurement of the p-type transistor is higher than the electric current specified in the specification; and in response to determining that the electric current measurement of the n-type transistor is less than the electric current specified in the corresponding transistor specification but the electric current measurement of the p-type transistor is higher than the electric current specified in the specification, determining that the cause of the deviation lies in one or more manufacturing tools that are common to both the n-type transistor and the p-type transistor but have opposite physical effects to both transistors.

15. The system according to claim 11, wherein the processor is further configured to perform steps of:

determining whether the first collected measurements of the first product correlates with the second collected measurements of the second product; and in response to determining that the first collected measurements of the first product does not correlate with the second collected measurements of the second product, determining that the cause of the deviation lies in one or more manufacturing tools that exist for the first manufactured product but does not exist for the second manufactured product.

16. The system according to claim 9, wherein the processor is further configured to perform steps of:

identifying one or more manufacturing tools that neither affects nor influences the determined cause of the detected deviation.

17. A computer program product for analyzing a functional deviation of one or more transistor device products, the computer program product comprising a non-transitory storage medium readable by a processing circuit and storing instructions run by the processing circuit for performing method steps, the method steps comprising:

initiating of manufacturing a first transistor product of a first polarity type and a second transistor product of a second polarity type by using similar manufacturing steps;

collecting first measurements associated with the manufactured first polarity type transistor product;

collecting second measurements associated with the manufactured second polarity type transistor product;

detecting a deviation in functionality in the manufactured first polarity type transistor product, the manufactured second polarity type transistor product or both the manufactured first polarity type transistor and second polarity type transistor products, based on the first collected measurements and the second collected measurements;

determining a cause of the detected deviation; and identifying at least one manufacturing tool associated with the determined cause of the detected deviation, wherein a processor coupled to a memory device performs the collecting the first measurements, the collecting the second measurements, the detecting, the determining, and the identifying.

18. The computer program product according to claim 17, wherein the manufactured first polarity type transistor product is a n-type transistor, and the manufactured second polarity type transistor product is a p-type transistor.

19. The computer program product according to claim 18, wherein the first collected measurements and the second collected measurements include an operating frequency measurement, an electric current measurement and an electric capacitance measurement.

* * * * *